US009859260B2

(12) United States Patent
Tagami et al.

(10) Patent No.: US 9,859,260 B2
(45) Date of Patent: Jan. 2, 2018

(54) OPTICAL COUPLING DEVICE HAVING A DRIVE CIRCUIT ON A GROUND FRAME TO DRIVE A LIGHT EMITTING ELEMENT ON A POWER FRAME

(71) Applicant: KABUSHIKI KAISHA TOSHIBA, Tokyo (JP)

(72) Inventors: Yuichi Tagami, Kitakyushu Fukuoka (JP); Yuta Kugiyama, Buzen Fukuoka (JP); Toyoaki Uo, Miyako Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 15/046,109

(22) Filed: Feb. 17, 2016

(65) Prior Publication Data

US 2016/0315074 A1    Oct. 27, 2016

(30) Foreign Application Priority Data

Apr. 24, 2015    (JP) .................................. 2015-089496

(51) Int. Cl.
*H01L 25/16* (2006.01)
*H04B 10/80* (2013.01)
(Continued)

(52) U.S. Cl.
CPC ...... *H01L 25/167* (2013.01); *H01L 23/49541* (2013.01); *H01L 23/49551* (2013.01);
(Continued)

(58) Field of Classification Search
CPC .............. H01L 33/62; H01L 23/49575; H01L 25/167; H01L 23/49537; H01L 23/49541;
(Continued)

(56) References Cited

U.S. PATENT DOCUMENTS 6,335,548 B1 * 1/2002 Roberts ............. H01L 23/49562
250/239
7,589,399 B2    9/2009 Kohashi
(Continued)

FOREIGN PATENT DOCUMENTS

CN    101989696 A    3/2011
CN    102347589 A    2/2012
(Continued)

OTHER PUBLICATIONS

Chinese Office Action dated Sep. 5, 2017, filed in Chinese counterpart Application No. 201510507311.1, 8 pages (with translation).

*Primary Examiner* — Que T Le
(74) *Attorney, Agent, or Firm* — Patterson & Sheridan, LLP

(57) ABSTRACT

An optical coupling device includes a power lead with a first portion and a power line portion. A light-emitting element is disposed on the first portion. A ground lead includes a ground line portion and a second portion with a drive circuit disposed thereon. A first input frame in the device includes a first input terminal portion and a first input signal line portion. A second input frame in the device includes a second input terminal portion and a second input signal line portion. The first and second input frames are adjacent to each other and a minimum distance from the first input signal line portion to the first installation portion is greater than a minimum distance from the first input signal line portion to the power line portion.

20 Claims, 10 Drawing Sheets

(51) Int. Cl.
*H01L 33/62* (2010.01)
*H01L 23/495* (2006.01)
*H01L 23/00* (2006.01)

(52) U.S. Cl.
CPC .. *H01L 23/49562* (2013.01); *H01L 23/49575* (2013.01); *H01L 24/49* (2013.01); *H01L 33/62* (2013.01); *H04B 10/802* (2013.01); *H01L 23/49537* (2013.01); *H01L 2224/48137* (2013.01); *H01L 2224/48247* (2013.01); *H01L 2224/48257* (2013.01); *H01L 2224/49171* (2013.01); *H01L 2924/00014* (2013.01); *H01L 2924/12041* (2013.01); *H01L 2924/1426* (2013.01); *H01L 2924/181* (2013.01)

(58) Field of Classification Search
CPC . H01L 23/49551; H01L 24/49; G02B 6/4201; H04B 10/80
USPC .............................................. 250/551, 214 R
See application file for complete search history.

(56) References Cited

U.S. PATENT DOCUMENTS

| | | | |
|---|---|---|---|
| 7,699,663 | B1 | 4/2010 | Little et al. |
| 8,660,162 | B2 | 2/2014 | Hata et al. |
| 8,853,658 | B2 | 10/2014 | Maasi et al. |
| 2008/0013298 | A1 | 1/2008 | Sharma et al. |

FOREIGN PATENT DOCUMENTS

| | | |
|---|---|---|
| JP | 2002050950 A | 2/2002 |
| JP | 2007019075 A | 1/2007 |
| JP | 2007059786 A | 3/2007 |
| JP | 2007318488 A | 12/2007 |
| JP | 4935257 B2 | 5/2012 |
| JP | 5094751 B2 | 12/2012 |

\* cited by examiner

OPTICAL COUPLING DEVICE HAVING A DRIVE CIRCUIT ON A GROUND FRAME TO DRIVE A LIGHT EMITTING ELEMENT ON A POWER FRAME

CROSS-REFERENCE TO RELATED APPLICATION

This application is based upon and claims the benefit of priority from Japanese Patent Application No. 2015-089496, filed Apr. 24, 2015, the entire contents of which are incorporated herein by reference.

FIELD

Embodiments described herein relate generally to an optical coupling device.

BACKGROUND

An optical coupling device such as an isolation amplifier is generally used in a circuit for driving a power semiconductor element such as an insulated gate bipolar transistor (IGBT). The optical coupling device generally includes a light-emitting element, a transmission integrated circuit (IC), and a receiving IC. When the light-emitting element emits an optical signal based on an electrical signal output from the transmission IC, the receiving IC receives the optical signal and converts the optical signal into an electrical signal for output.

One of main characteristics of the optical coupling device described above is an offset voltage. The offset voltage is a non-zero voltage output when an input signal is zero. For this reason, the output is set to zero when the input is zero by correcting the output voltage when using the optical coupling device. However, the offset voltage changes depending on temperature which makes correction difficult. The offset voltage temperature variability can be affected by the magnitude of the offset voltage, such that it is desirable to reduce the magnitude of the offset voltage so as to suppress variation within the expected temperature change range.

DETAILED DESCRIPTION

Figure 1:
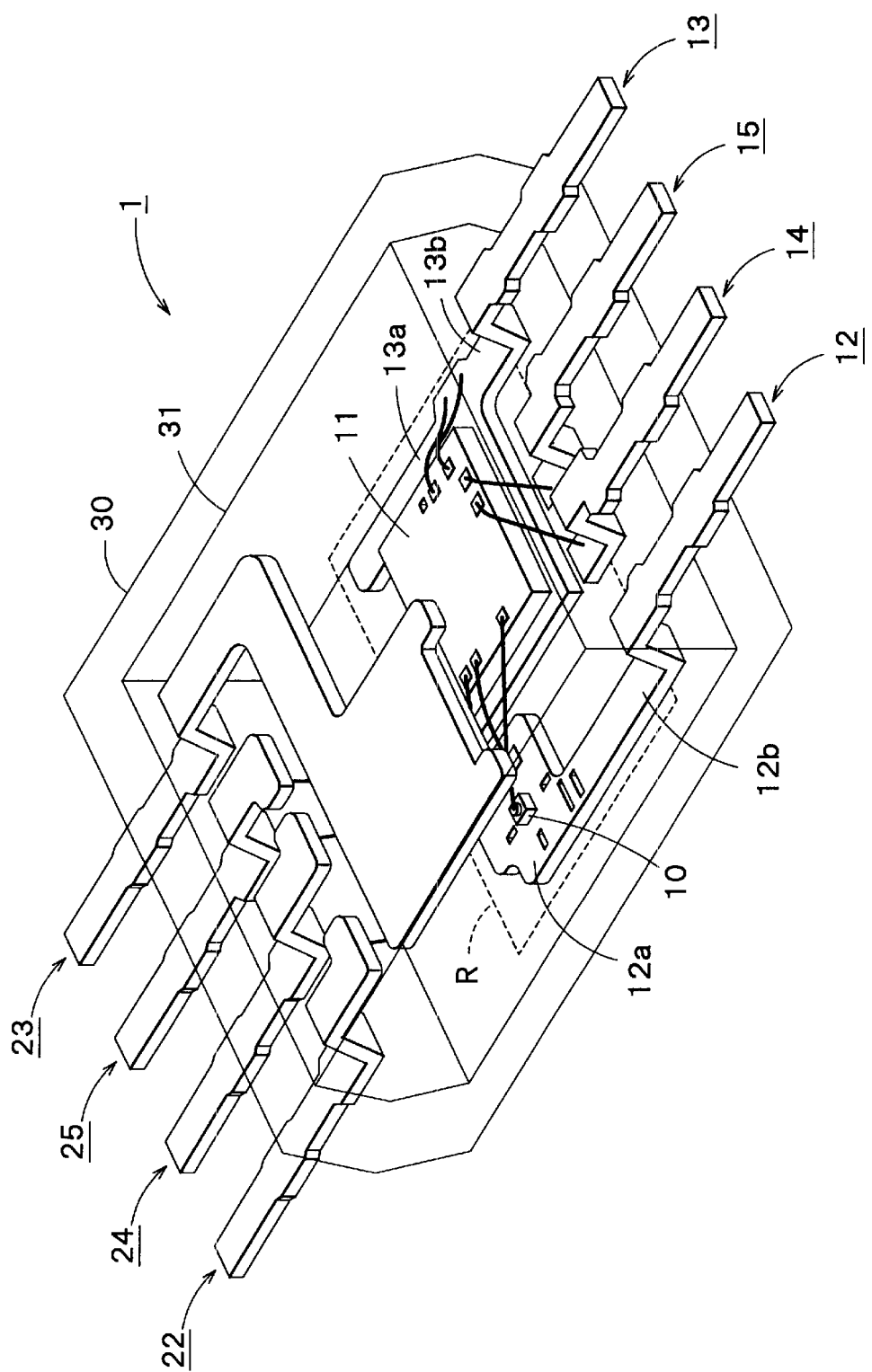
FIG. 1 is a perspective view illustrating an inside of an optical coupling device according to a first embodiment as viewed from the above.

In general, according to one embodiment, an optical coupling device includes a power frame (power lead frame) including a first installation portion and a power line portion connected to the first installation portion. The first installation portion has a light-emitting element, such as, for example, a light-emitting diode, disposed thereon. A ground frame (ground lead frame) includes a second installation portion and a ground line portion connected to the second installation portion. The second installation portion has a drive circuit, which may be an integrated circuit, disposed thereon. The drive circuit is configured to drive the light-emitting element by, for example, supplying one or more electrical signals. A first input frame (first input lead frame) includes a first input terminal portion, which is between the power line portion and the ground line portion, and a first input signal line portion, which is closer to the drive circuit (e.g., a spacing distance is less) than is the first input terminal portion. And a second input frame (second input lead frame) includes a second input terminal portion, which is between the first input terminal portion and the ground line portion, and a second input signal line portion, which is closer to the drive circuit (e.g., a spacing distance is less) than is the second input terminal portion. The first and second input frames are adjacent to each other. The minimum distance from the first input signal line portion to the first installation portion is greater than the minimum distance from the first input signal line portion to the power line portion.

In general, according to another embodiment, an optical coupling device includes a first frame having a first installation portion and a first power terminal portion. The first power terminal portion extends from first installation portion along a first direction. The first installation portion has a light-emitting element, such as, for example, a light-emitting diode, disposed thereon. A second frame includes a second installation portion and a second power terminal portion. The second power terminal power extends from the second installation portion along the first direction. The second installation portion has an integrated circuit, such as, for example, a drive circuit for driving a light-emitting element, disposed thereon. The integrated circuit is configured to supply control signals to the light-emitting element. A first input frame includes a first input terminal portion and a first input signal line portion that is between the second installation portion and the first input terminal portion along a longitudinal direction of the first input frame. Here, the longitudinal direction of the first input frame corresponds to the lengthwise direction of the first input frame. And a second input frame includes a second input terminal portion and a second input signal line portion that is between the second installation portion and the second input terminal portion along a longitudinal direction of the second input frame. Here, the longitudinal direction of the second input frame corresponds to the lengthwise direction of the second input frame. The first and second input frames are adjacent to each other in a second direction crossing the first direction. The first input terminal portion is between the first power terminal portion and the second input terminal in the second direction. The second input terminal portion is between the second power terminal and the first input terminal in the second direction. And the first input frame and the second input frame are mirror images of each other with respect to a center line extending in a longitudinal direction between the first input frame and the second input frame. Here, the longitudinal direction corresponds to the lengthwise directions of the first and second input frames.

Hereinafter, exemplary embodiments will be described with reference to drawings. In the following embodiments, a characteristic configuration in the optical coupling device will be mainly described, but the optical coupling device has a configuration which is omitted in the following description. However, such an omitted configuration is included in the embodiments of the present disclosure.

First Embodiment

FIG. 1 is a perspective view illustrating an inside of an optical coupling device according to a first embodiment as viewed from the above. In addition, FIG. 2 is a perspective view illustrating an internal structure of the optical coupling device according to the first embodiment, as viewed from the side.

Figure 2:
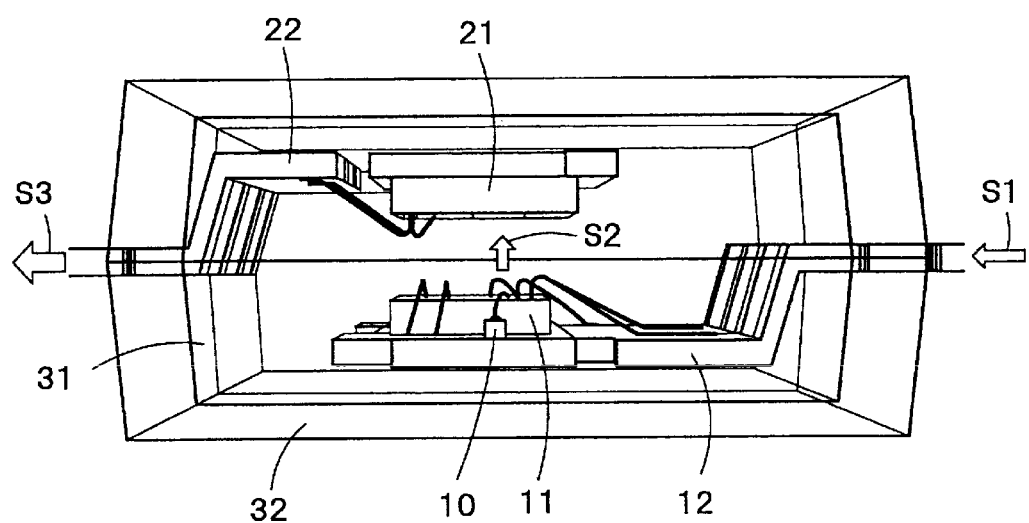
FIG. 2 is a perspective view illustrating an internal structure of the optical coupling device according to the first embodiment, as viewed from the side.

An optical coupling device 1, illustrated in FIGS. 1 and 2, includes a transmitter which transmits an optical signal and a receiver which receives the optical signal. As illustrated in FIG. 2, the transmitter emits an optical signal S2 (for example a digital signal) towards the receiver. The optical signal S2 is based on an electrical signal S1 (for example, an analog signal) which is input from outside the optical coupling device 1. When the receiver is, for example, an analog signal output type, the receiver receives the optical signal S2 of a digital type and converts the optical signal S2 into an electrical signal of an analog type to output an electrical signal S3, which may be further amplified. In addition, when the receiver is a digital signal output type, the receiver outputs the electrical signal S3 of a digital type in a similar manner.

First, a configuration of the transmitter will be described with reference to FIG. 1. The transmitter includes a light-emitting element 10, a transmission integrated circuit (IC) 11, a power frame 12, a ground frame 13, and first and second input frames 14 and 15.

The light-emitting element 10 emits the optical signal S2 towards the receiver. Here, the light-emitting element 10 is a light emitting diode (LED). However, the light-emitting element 10 is not limited to the LED, but may be another type of light-emitting element in other embodiments.

The transmission IC 11 includes various signal processing circuits that are drive circuits of the light-emitting element 10. These signal processing circuits convert analog electrical signal S1, which is input from the outside, into a digital signal, and outputs a modulation signal (for example, Pulse Width Modulation (PWM) signal) which is made by modulating the digital signal. The light-emitting element 10 emits the optical signal S2 based on the modulation signal.

Figure 3:
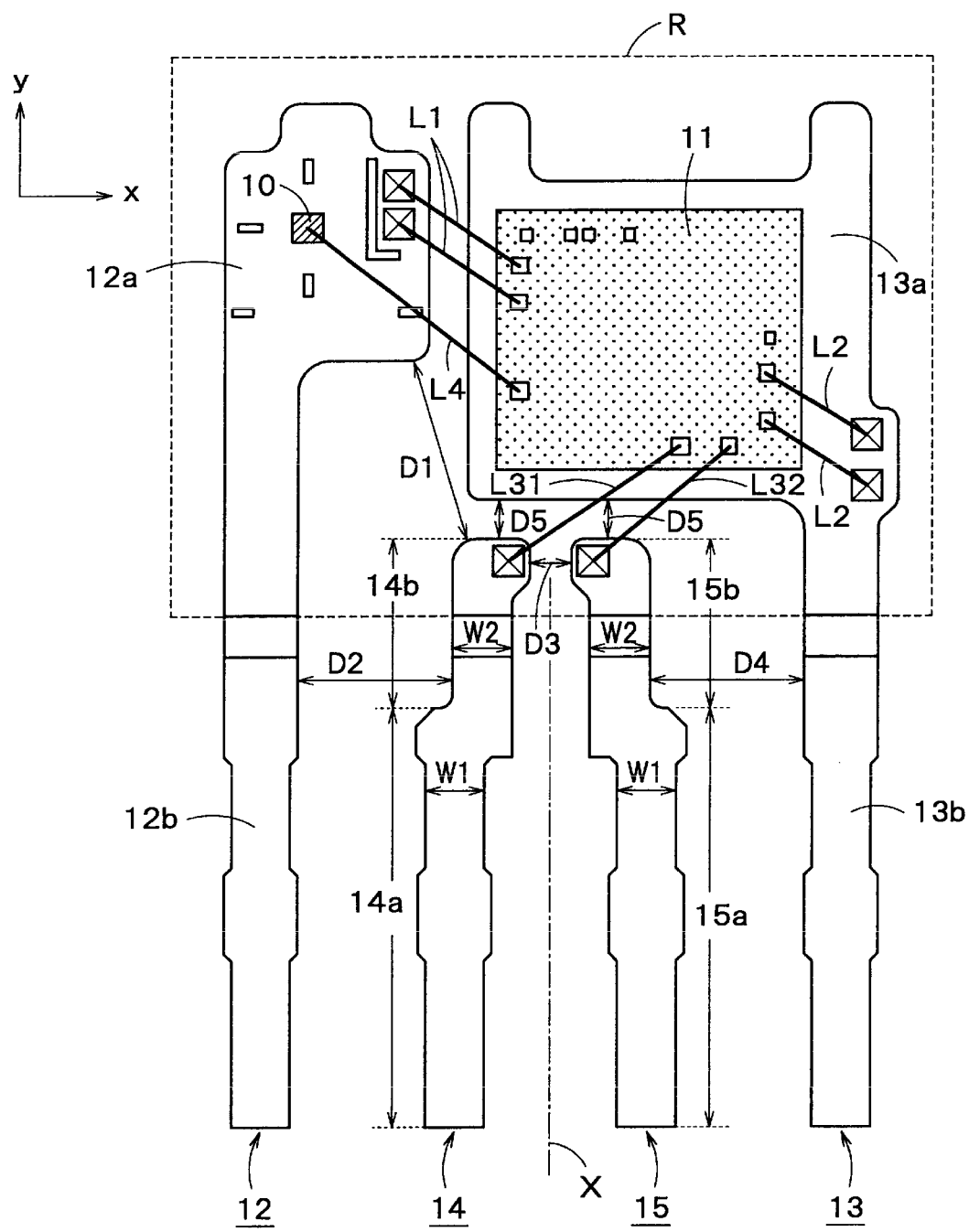
FIG. 3 is a plan view illustrating a frame configuration of a transmitter of the optical coupling device according to the first embodiment.

Hereinafter, with reference to FIG. 3, the power frame 12, the ground frame 13, and the first and the second input frames 14 and 15 in FIG. 1 will be described. FIG. 3 is a plan view illustrating a frame configuration of the transmitter of the optical coupling device 1.

The power frame 12 includes a first installation portion 12a and a power line portion 12b. The first installation portion 12a extends in a width direction x, and the light-emitting element 10 is provided therein. The power line portion 12b is connected to the first installation portion 12a. Power is supplied to the light-emitting element 10 or the transmission IC 11 through the power line portion 12b from an external power supply.

The ground frame 13 includes a second installation portion 13a and a ground line portion 13b. The second installation portion 13a extends in the width direction x so as to face the first installation portion 12a side, and the transmission IC 11 is provided therein (or thereon). The ground line portion 13b is connected to the second installation portion 13a.

The transmission IC 11 (provided in or on the second installation portion 13a) is electrically connected to the first installation portion 12a by two power wires L1 extending in a first direction, and is electrically connected to the ground line portion 13b by two ground wires L2 extending in the first direction like the power wires L1. In addition, the transmission IC 11 is electrically connected to a first input frame 14 by a first signal wire L31 extending in a second direction, which is a direction intersecting with the first direction, and is electrically connected to the second input frame 15 by a second signal wire L32. Furthermore, the transmission IC 11 is electrically connected to the light-emitting element 10 provided in the first installation portion 12a by a drive wire L4 extending in the first direction. A modulation signal generated by the transmission IC 11 is transferred to the light-emitting element 10 by the drive wire L4. The depicted number of power wires L1 and the number of ground wires L2 is for example only, and the numbers are not particularly limited to those depicted.

The first input frame 14 includes a first input terminal portion 14a, and a first input signal line portion 14b. In addition, the second input frame 15 also includes a second input terminal portion 15a and a second input signal line portion 15b in the same manner as the first input frame 14.

In the first embodiment, the first input frame 14 and the second input frame 15 are configured as a pair of input frames. In the same manner, the first input terminal portion 14a and the second input terminal portion 15a are configured as a pair of input terminal portions, and the first input signal line portion 14b and the second input signal line portion 15b are configured as a pair of input signal line portions. Moreover, a positive potential is input to the first input frame 14, and a negative potential is input to the second input frame 15. A differential voltage between the first input frame 14 and the second input frame 15 is input to the transmission IC 11 as the electrical signal S1.

The first and the second input terminal portions 14a and 15a are provided between the power line portion 12b and the ground line portion 13b. Specifically, the first input terminal portion 14a is provided between the power line portion 12b and the ground line portion 13b, and between the power line portion 12b and the second input terminal portion 15a, and the second input terminal portion 15a is provided between the power line portion 12b and the ground line portion 13b, and between the first input terminal portion 14a and the ground line portion 13b.

The first input signal line portion 14b extends from an inside of the first input terminal portion 14a to the transmission IC 11, and the second input signal line portion 15b extends from an inside of the second input terminal portion 15a to the transmission IC 11. That is, the first input signal line portion 14b is provided on the second installation portion 13a side with respect to the first input terminal portion, and the second input signal line portion 15b is provided on the second installation portion 13a side with respect to the second input terminal portion 15a.

In the first embodiment, a line width W2 of each of the first and the second input signal line portions 14b and 15b is equal to a line width W1 of each of the first and the second input terminal portions 14a and 15a. Therefore, it is possible to sufficiently ensure an area for bonding and joining the first and the second signal wires L31 and L32 in the first and the second input signal line portions 14b and 15b. Here, "equal line widths" mean that widths of main portions of the input signal line portions have a same width within a range of normal dimensional error tolerances that is acceptable on design or expected in manufacturing, and the line widths may be said to be approximately or roughly the same as each other when "equal."

With reference to FIG. 1, the power frame 12, the ground frame 13, and the first and the second input frames 14 and 15 are bent at the middle in a height direction (thickness direction) of each frame. That is, each frame includes a portion present in a first plane and a portion present in a second plane that is relatively higher than the first plane by a height of the bent portion. A plane R illustrated in FIGS. 1 and 3 shows the first plane.

Next, back to FIGS. 1 and 2, a configuration of a receiver of the optical coupling device 1 will be described. The receiver is configured to have a receiving IC 21, a power frame 22, a ground frame 23, and output frames 24 and 25, as illustrated in FIG. 1.

As illustrated in FIG. 2, the receiving IC 21 is provided to face the light-emitting element 10. The receiving IC 21 includes a receiving circuit which receives the optical signal S2, particularly a light-receiving element and various signal processing circuits. The light-receiving element receives the optical signal S2 and converts the optical signal into an electrical signal. This signal processing circuit demodulates an electrical signal generated by the light-receiving element and outputs the amplified electrical signal S3. The electrical signal S3 may be an analog signal or may be a digital signal.

The power frame 22 is electrically connected to the receiving IC 21. Power is supplied to the receiving IC 21 through the power frame 22 from an external power supply. The receiving IC 21 is provided in the ground frame 23. The output frames 24 and 25 are electrically connected to the receiving IC 21. The electrical signal S3 generated by the receiving IC 21 is transferred to the outside by the output frames 24 and 25.

As illustrated in FIGS. 1 and 2, the light-emitting element 10, the transmission IC 11, and the receiving IC 21 are covered with a first covering member 31 in the optical coupling device 1 according to the first embodiment. The first covering member 31 contains a translucent material so as not to interfere with a transmission and a reception of the optical signal S2 between the light-emitting element 10 and the receiving IC 21. Moreover, an outer surface of the first covering member 31 is covered with a second covering member 32. The second covering member 32 contains a light-shielding material so as to prevent the receiving IC 21 from unintended activation by reception of external light.

Following the optical coupling device 1 according to the first embodiment described above, an optical coupling device according to a comparative example will be described. The optical coupling device according to the comparative example includes a transmitter and a receiver. A configuration of the receiver is the same as in the optical coupling device it, such that the description thereof will be omitted, and hereinafter, a configuration of the transmitter will be described.

Figure 4:
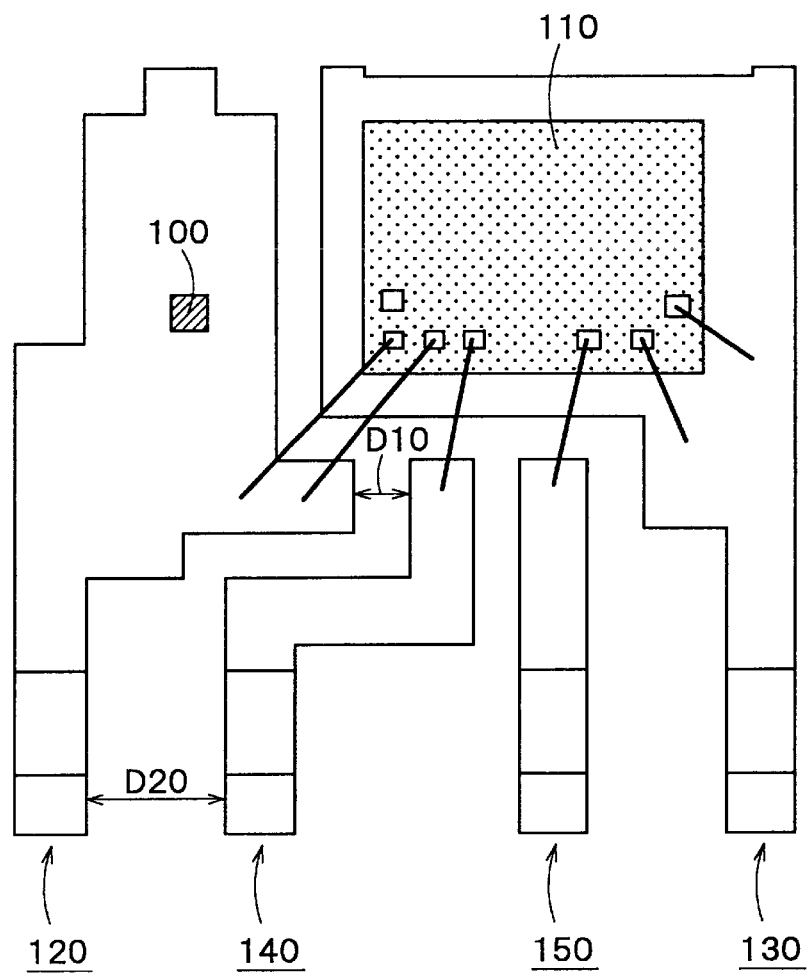
FIG. 4 is a plan view illustrating a configuration of a transmitter of an optical coupling device according to a comparative example.

FIG. 4 is a plan view illustrating a configuration of the transmitter of the optical coupling device according to the comparative example. As illustrated in FIG. 4, the transmitter according to the comparative example includes a light-emitting element 100, a transmission IC 110, a power frame 120, a ground frame 130, and first and second input frames 140 and 150.

The light-emitting element 100 can be like the light-emitting element 10, and is provided on the power frame 120. The transmission IC 110 can be like the transmission IC 11 described above, and is provided on the ground frame 130. The first and the second input frames 140 and 150 are electrically connected to the transmission IC 110.

In the transmitter configured according to the comparative example, as a current in a pulse shape flows from the power frame 120 to the ground frame 130, electromagnetic waves are radiated from each of the power frame 120 and the ground frame 130. Electromotive force is generated in the first input frame 140 and the second input frame 150 by the electromagnetic waves, and is input to the transmission IC 110, whereby an offset voltage is generated. The electromotive force corresponds to the offset voltage, such that the offset voltage is increased as the electromotive force becomes large.

In the comparative example illustrated in FIG. 4, a minimum distance D10 from a tip end of the first input frame 140 positioned on the transmission IC 110 side to the power frame 120 is shorter than a distance D20 between a signal line portion of the first input frame 140 and a power line portion of the power frame 120. That is, the tip end of the first input frame 140 is positioned close to the power frame 120. Therefore, in particular, large electromotive force is generated in the first input frame 140 by electromagnetic waves from the power frame 120, and the electromotive force is input to the transmission IC 110, such that it is considered that the offset voltage is caused to be increased.

In contrast, in the optical coupling device 1 according to the first embodiment, as illustrated in FIG. 3, the minimum distance D1 from the first input signal line portion 14b of the first input frame 14 to the first installation portion 12a is longer than the distance D2 between the first input signal line portion 14b and the power line portion 12b. That is, the minimum distance from the end of the first input frame 14 to the power frame 12 is longer than that in the comparative example. Therefore, electromotive force of the first input frame 14 caused by electromagnetic waves from the power frame 12 is smaller than electromotive force of the first input frame 140 caused by electromagnetic waves from the power frame 120. Therefore, it is possible to reduce the offset voltage.

Moreover, in the first embodiment, a distance D5 between the first and the second input signal line portions 14b and 15b and the second installation portion 13a is shorter than the minimum distance D1. Furthermore, in the first embodiment, the first signal wire L31 and the second signal wire L32 are arranged farther from the power wire L1 than the drive wire L4. That is, the first and the second input signal line portions 14b and 15b, and the first and the second signal wires L31 and L32 are arranged as far as possible from the first installation portion 12a side in which strength of the electromagnetic waves is relatively large. Therefore, the first and the second input signal line portions 14b and 15b are hardly affected by the electromagnetic waves, and this contributes to a reduction of the offset voltage.

In addition, to reduce the offset voltage, it is desirable that mutual inductance values of the first and the second input frames 14 and 15 are the same as each other. Specifically, it is desirable that the mutual inductance value of the first input frame 14 with respect to the power frame 12 is the same as the mutual inductance value of the second input frame 15 with respect to the power frame 12, and the mutual inductance value of the first input frame 14 with respect to the ground frame 13 is the same as the mutual inductance value of the second input frame 15 with respect to the ground frame 13. As a method of approaching such a relationship between mutual inductance values, it is considered to decrease a coupling coefficient.

Therefore, in the first embodiment, the two power wires L1 and the two ground wires L2 are arranged in a direction intersecting the first and the second signal wires L31 and L32, thereby decreasing the coupling coefficient. As a result, the mutual inductance values of the first and the second input frames 14 and 15 are substantially the same as each other, and the offset voltage is reduced. Intersection herein includes a case where the power wires and ground wires are orthogonal or substantially orthogonal to the first and the second signal wires, and includes a direction in which the power wires and ground wires intersect with the first and the second signal wires to reduce the offset voltage as compared to the comparative example.

Furthermore, in the first embodiment, as illustrated in FIG. 3, each wire extends in a direction not in parallel with the width direction x but at an angle of approximately 45 degrees to the width direction x. Therefore, for example, when the resin used to form first covering member 31 is poured from a longitudinal direction y of a frame to be molded, stress caused by the first covering member 31 is relaxed as compared to when each wire extends perpendicular to the flow direction. That is, each wire is configured so as not to be perpendicular to a direction in which the resin flows. The wires are also preferably not placed in parallel with the x direction, but rather at an angle to the x direction. Accordingly, deformation of each wire may be suppressed.

Moreover, it is desirable that a voltage difference between electromotive force of the first and the second input frames 14 and 15 caused by the electromagnetic waves is small so as to reduce the offset voltage.

Therefore, in the optical coupling device 1 according to the first embodiment, as illustrated in FIG. 3, an interval between the first input signal line portion 14b and the second input signal line portion 15b has the narrowest interval D3 at a tip end on the transmission IC 11 side. That is, the tip ends of the first and the second input signal line portions 14b and 15b are proximate to each other at a spacing D3. Therefore, lengths of the first and the second signal wires L31 and L32, which respectively extend from the first and the second input signal line portions 14b and 15b to the transmission IC 11, may be substantially the same as each other. Accordingly, inductance values of the first and the second signal wires L31 and L32 may be substantially the same as each other, such that a difference in voltage between electromotive forces of the first and the second input frames 14 and 15 caused by the electromagnetic waves may be reduced. Therefore, it is possible to reduce the offset voltage.

Furthermore, the first and the second input terminal portions 14a and 15a are formed to be mirror images of each other with respect to a center line X extending between these portions and the first and the second input signal line portions 14b and 15b are also formed to be mirror images of each with respect to the center line X extending between these portions. Therefore, electromotive force generated in the entire first input frame 14 is substantially the same as electromotive force generated in the entire second input frame 15, such that the difference in voltage between these electromotive forces becomes small. Therefore, the offset voltage may be further suppressed.

Modification Example 1.1

Figure 5:
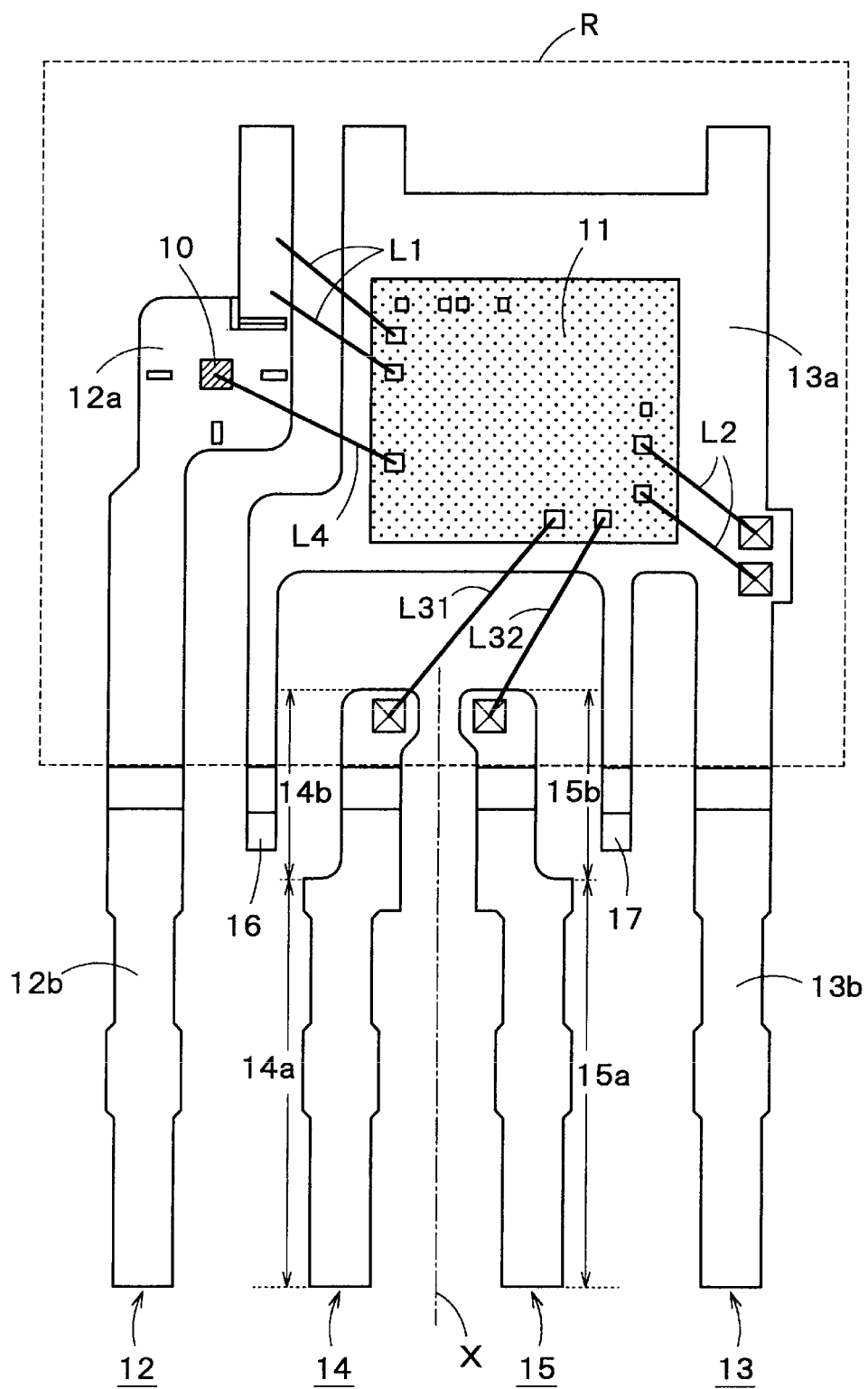
FIG. 5 is a plan view illustrating a frame configuration of a transmitter of an optical coupling device according to a modification (Modification Example 1.1) of the first embodiment.

Modification Example 1.1 of the first embodiment will be described. This modification example is different from the first embodiment in a frame configuration of the transmitter. Hereinafter, a frame configuration of a transmitter of an optical coupling device according to this modification example will be described with reference to FIG. 5. FIG. 5 is a plan view illustrating the frame configuration of the transmitter of the optical coupling device according to Modification Example 1.1.

As illustrated in FIG. 5, the ground frame 13 according to the modification example includes a first protrusion 16 and a second protrusion 17. The first protrusion 16 protrudes between the power line portion 12b and the first input signal line portion 14b from the second installation portion 13a. The second protrusion 17 protrudes between the ground line portion 13b and the second input signal line portion 15b from the second installation portion 13a.

According to this modification example, the first input signal line portion 14b is less affected by the electromagnetic waves from the power line portion 12b due to the shielding presence of the first protrusion 16. The second input signal line portion 15b is less affected by the electromagnetic waves from the ground line portion 13b due to the shielding presence of the second protrusion 17. That is, since the first protrusion 16 and the second protrusion 17 function as electromagnetic shields, it is possible to reduce electromotive force generated in the first and the second input frames 14 and 15. Therefore, it is possible to further reduce the offset voltage.

In addition, since a planar area of the second installation portion 13a is increased due to the addition of the first protrusion 16 and the second protrusion 17, a heat dissipation pathway for the transmission IC 11 is increased. For this reason, a temperature change in the transmission IC 11 during operation is reduced, such that it is possible to suppress a change in the offset voltage caused by the temperature change.

Modification Example 2.1

Figure 6:
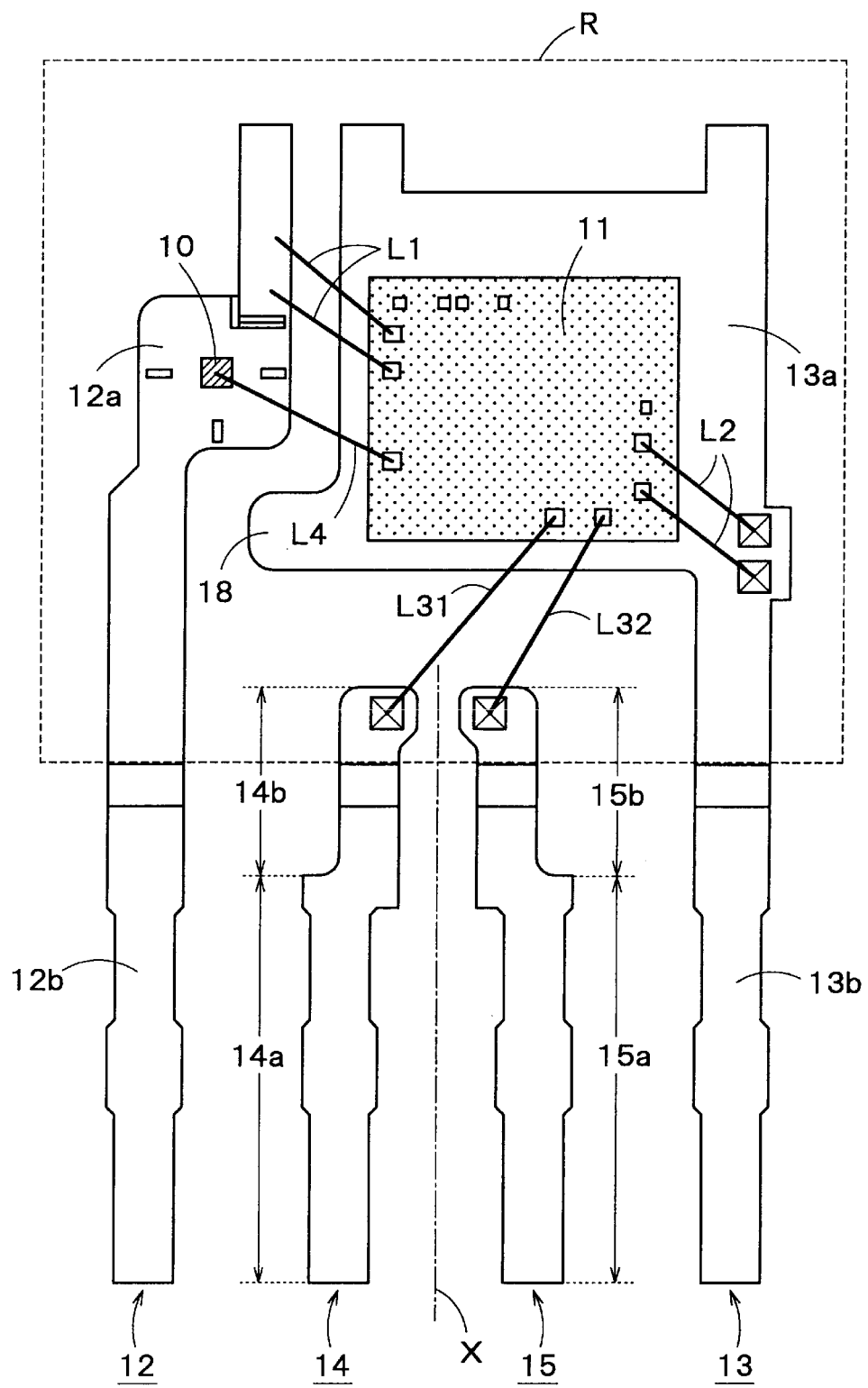
FIG. 6 is a plan view illustrating a frame configuration of a transmitter of an optical coupling device according to a modification (Modification Example 2.1) of the first embodiment.

Modification Example 2.1 of the first embodiment will be described. This modification example is different from Modification Example 1.1 in a shape of the ground frame 13. A configuration of the ground frame 13 according to this modification example will be described with reference to FIG. 6. FIG. 6 is a plan view illustrating a frame configuration of a transmitter of an optical coupling device according to Modification Example 2.1.

As illustrated in FIG. 6, the ground frame 13 according to this modification example includes a third protrusion 18, but as depicted in FIG. 6 does not include the first protrusion 16 and the second protrusion 17 from the Modification Example 1.1. The third protrusion 18 protrudes between the first installation portion 12a and the first input signal line portion 14b from the second installation portion 13a.

According to this Modification Example 2.1, the first and the second input signal line portions 14b and 15b are less affected by the electromagnetic waves from the first installation portion 12a due to the shielding presence of the third protrusion 18. That is, since the third protrusion 18 functions as an electromagnetic shield, the electromotive force generated in the first and the second input frames 14 and 15 may be further reduced. Therefore, it is possible to further reduce the offset voltage.

Moreover, in this modification example, since a planar area of the second installation portion 13a is increased due to the third protrusion 18, the heat dissipation pathway for the transmission IC 11 is increased. For this reason, a temperature change in the transmission IC 11 during operation is reduced, such that it is possible to suppress a change in the offset voltage caused by the temperature change.

Second Embodiment

The optical coupling device according to the second embodiment includes a transmitter and a receiver in the same manner as the first embodiment. The receiver has substantially the same configuration as the optical coupling device 1 according to the first embodiment, so additional description thereof will be omitted. However, in the second embodiment, the transmitter is different from that used in the first embodiment in that a frame configuration for the transmitter is different. Hereinafter, a difference in the frame configuration for the transmitter in the second embodiment will be described by referring to FIG. 7.

Figure 7:
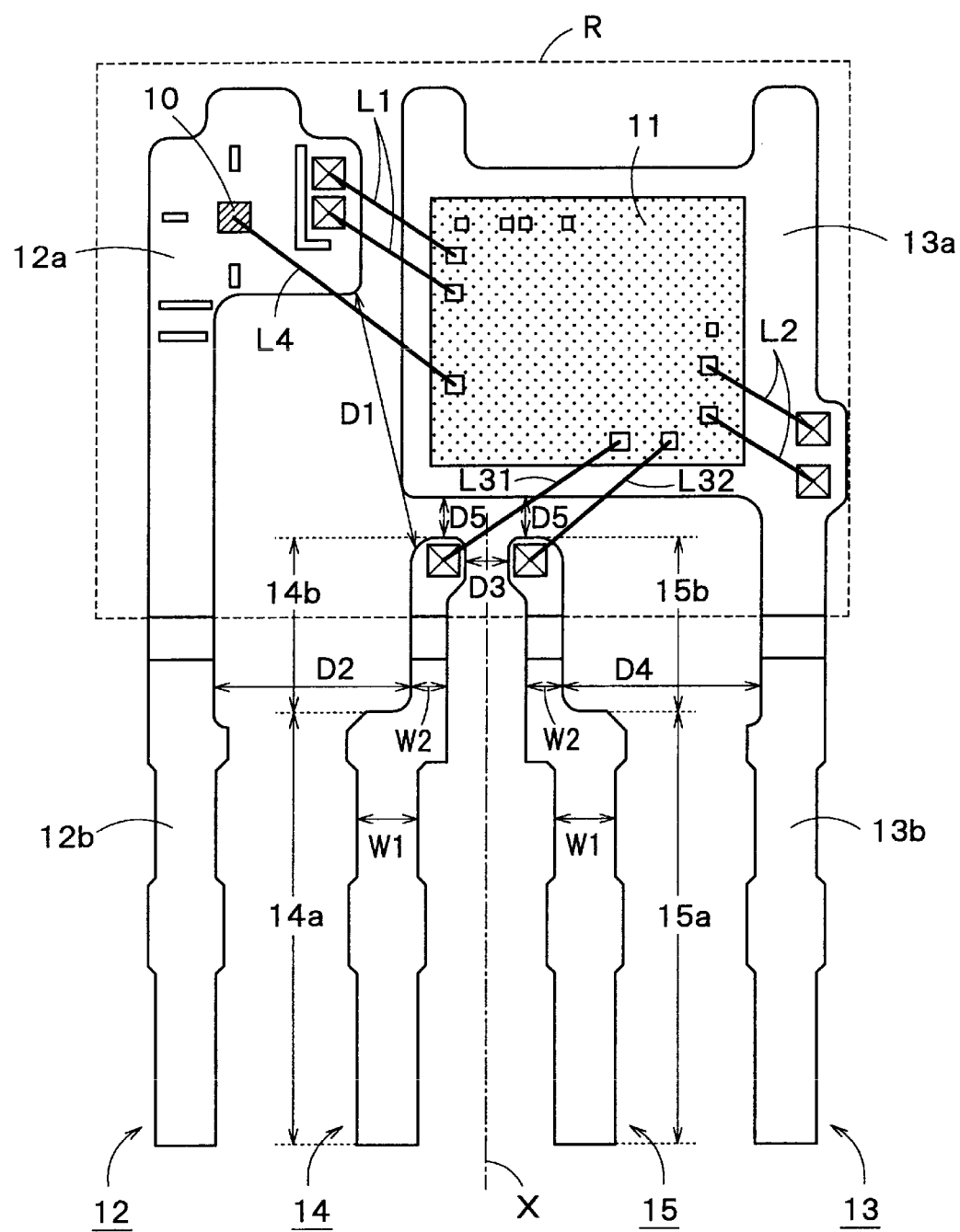
FIG. 7 is a plan view illustrating a frame configuration of a transmitter of an optical coupling device according to a second embodiment.

FIG. 7 is a plan view illustrating a frame configuration of the transmitter of the optical coupling device according to the second embodiment. The optical coupling device according to the second embodiment is different from the optical coupling device according to the first embodiment in that the line width W2 of each of the first and the second input signal line portions 14b and 15b is less than the line width W1 of each of the first and the second input terminal portions 14a and 15a.

According to the second embodiment, in substantially the same manner as in the first embodiment, a minimum distance D1 from the first input signal line portion 14b to the first installation portion 12a is greater than a distance D2 between the first input signal line portion 14b and the power line portion 12b. Therefore, electromotive force of the first input frame 14 caused by the electromagnetic waves from the power frame 12 is smaller than a corresponding electromotive force of the first input frame 140 (see FIG. 4) caused by the electromagnetic waves from the power frame 120 (see FIG. 4) in the comparative example. Accordingly, it is possible to reduce the offset voltage in the second embodiment as compared to the comparative example (FIG. 4).

In particular, in the second embodiment, since the line width W2 of the first input signal line portion 14b is smaller than the line width W1 of the first input terminal portion 14a, the distance D2 between the first input signal line portion 14b and the power line portion 12b is greater than that in the first embodiment. In the same manner, since the line width W2 of the second input signal line portion 15b is also smaller than the line width W1 of the second input terminal portion 15a, a distance D4 between the second input signal line portion 15b and the ground line portion 13b is also greater than that in the first embodiment. Furthermore, the first input signal line portion 14b has a shorter length and a wider interval (spacing distance) from the power line portion 12b than the spacing distance between first input terminal portion 14a and the power line portion 12b. Similarly, the second input signal line portion 15b has a shorter length and a wider interval (spacing distance) from the ground line portion 13b than the spacing distance between the second input terminal portion 15a and the ground line portion 13b.

For this reason, the first input signal line portion 14b according to the second embodiment is less affected by the electromagnetic waves from the power line portion 12b as compared to the first embodiment. In the same manner, the second input signal line portion 15b is also less affected by the electromagnetic waves from the ground line portion 13b as compared to the first embodiment. Accordingly, since electromotive force generated in the first and the second input frames 14 and 15 may be further reduced, it is possible to further reduce the offset voltage.

Figure 8:
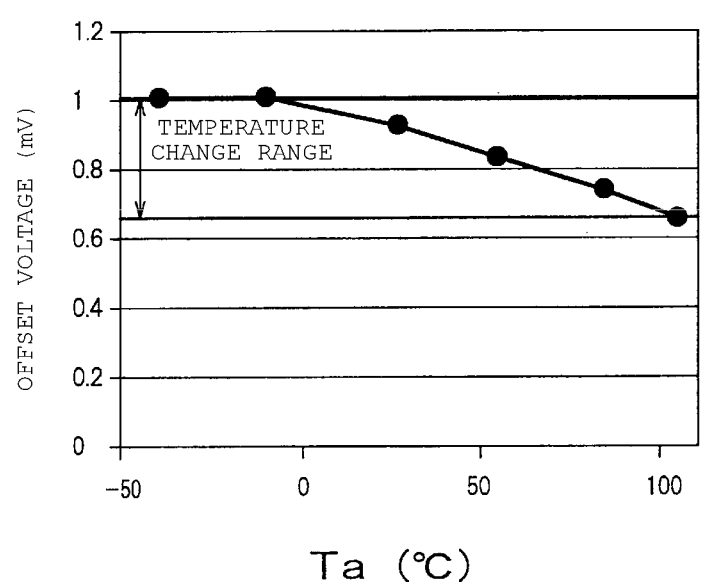
FIG. 8 is a graph illustrating temperature characteristics of an offset voltage of the optical coupling device according to the second embodiment.

FIG. 8 is a graph depicting temperature characteristics of the offset voltage of the optical coupling devices according to the second embodiment. In FIG. 8, the horizontal axis is an ambient temperature Ta of the optical coupling device, and the vertical axis is an offset voltage of the optical coupling device. According to FIG. 8, the range of the offset voltage in a range of from about −50° C. to about 100° C. is about 0.35 mV, which is very small as compared to the range in the offset voltage expected in the comparative example.

In the second embodiment, in a similar manner as in the first embodiment, the first and the second signal wires L31 and L32 are arranged in a direction of intersecting with the two power wires L1 and the two ground wires L2, the interval D3 in the tip end on the transmission IC 11 side is narrowest, the first and the second input frames 14 and 15 are formed to be mirror images of each with respect to a center line X, whereby further reduction in the offset voltage is can be provided.

Modification Example 1.2

Figure 9:
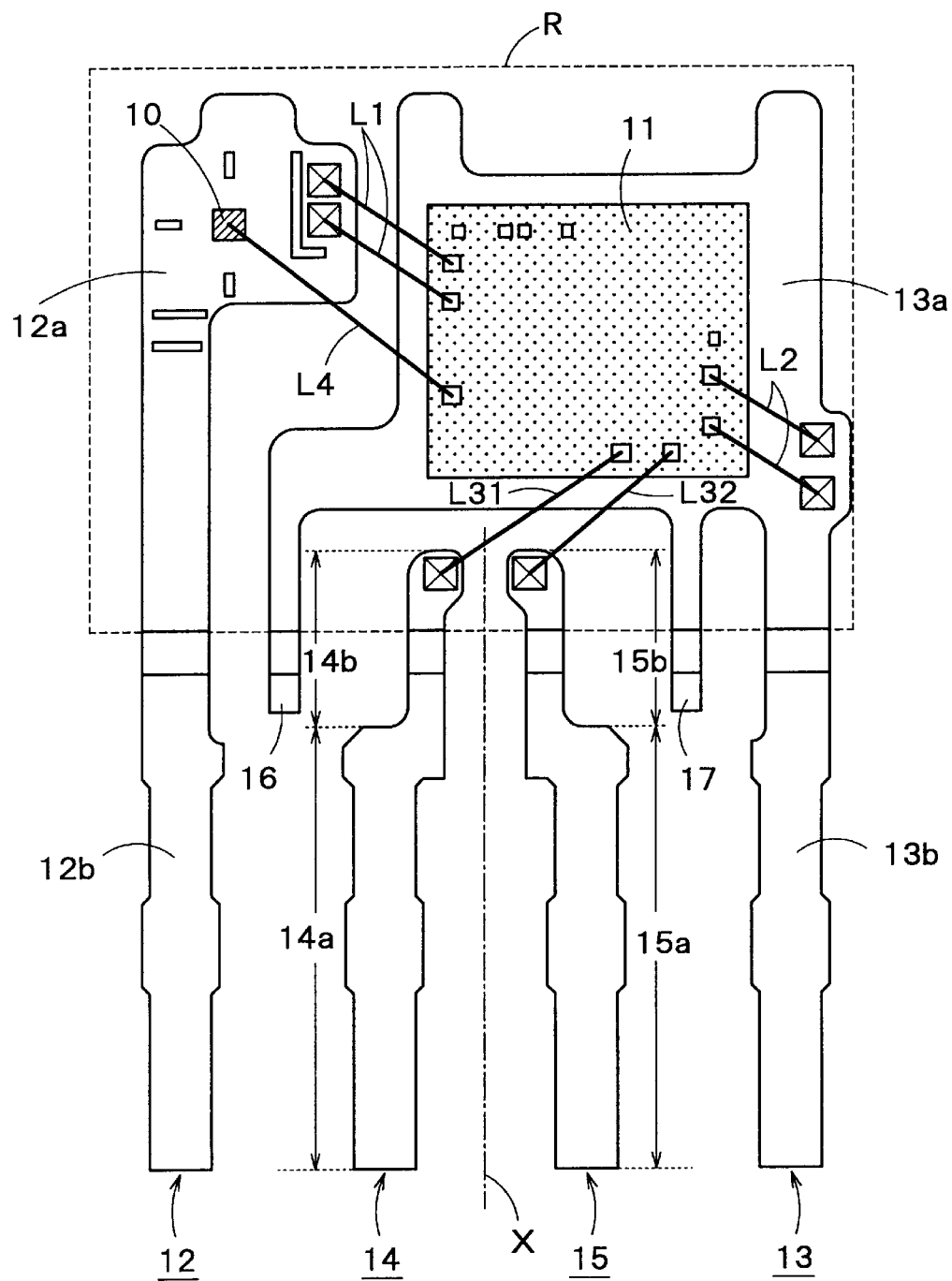
FIG. 9 is a plan view illustrating a frame configuration of a transmitter of an optical coupling device according to a modification (Modification Example 1.2) of the second embodiment.

Modification Example 1.2 of the second embodiment will be described. In this modification example, a frame configuration of the transmitter is modified from that in the second embodiment. Hereinafter, a frame configuration of the transmitter of the optical coupling device according to this modification example will be described with reference to FIG. 9. FIG. 9 is a plan view illustrating the frame configuration of the transmitter of the optical coupling device according to Modification Example 1.2.

As illustrated in FIG. 9, the ground frame 13 according to this modification example includes the first protrusion 16 and the second protrusion 17. These protrusions are configured in substantially the same manner as in Modification Example 1.1 (illustrated in FIG. 5). That is, the first protrusion 16 protrudes between the power line portion 12b and the first input signal line portion 14b from the second installation portion 13a, and the second protrusion 17 protrudes between the ground line portion 13b and the second input signal line portion 15b from the second installation portion 13a.

According to this Modification Example 1.2, the first input signal line portion 14b is less affected by the electromagnetic waves from the power line portion 12b due to the shielding presence of the first protrusion 16, and the second input signal line portion 15b is less affected by the electromagnetic waves from the ground line portion 13b due to the shielding presence of the second protrusion 17.

Accordingly, it is possible to further reduce the electromotive force generated in the first and the second input frames 14 and 15.

In addition, since a planar area of the second installation portion 13a is increased due to the first protrusion 16 and the second protrusion 17, the heat dissipation pathway of the transmission IC 11 is increased. Therefore, a temperature change in the transmission IC 11 is reduced and it is possible to suppress a change in the offset voltage caused by the temperature change.

Modification Example 2.2

Figure 10:
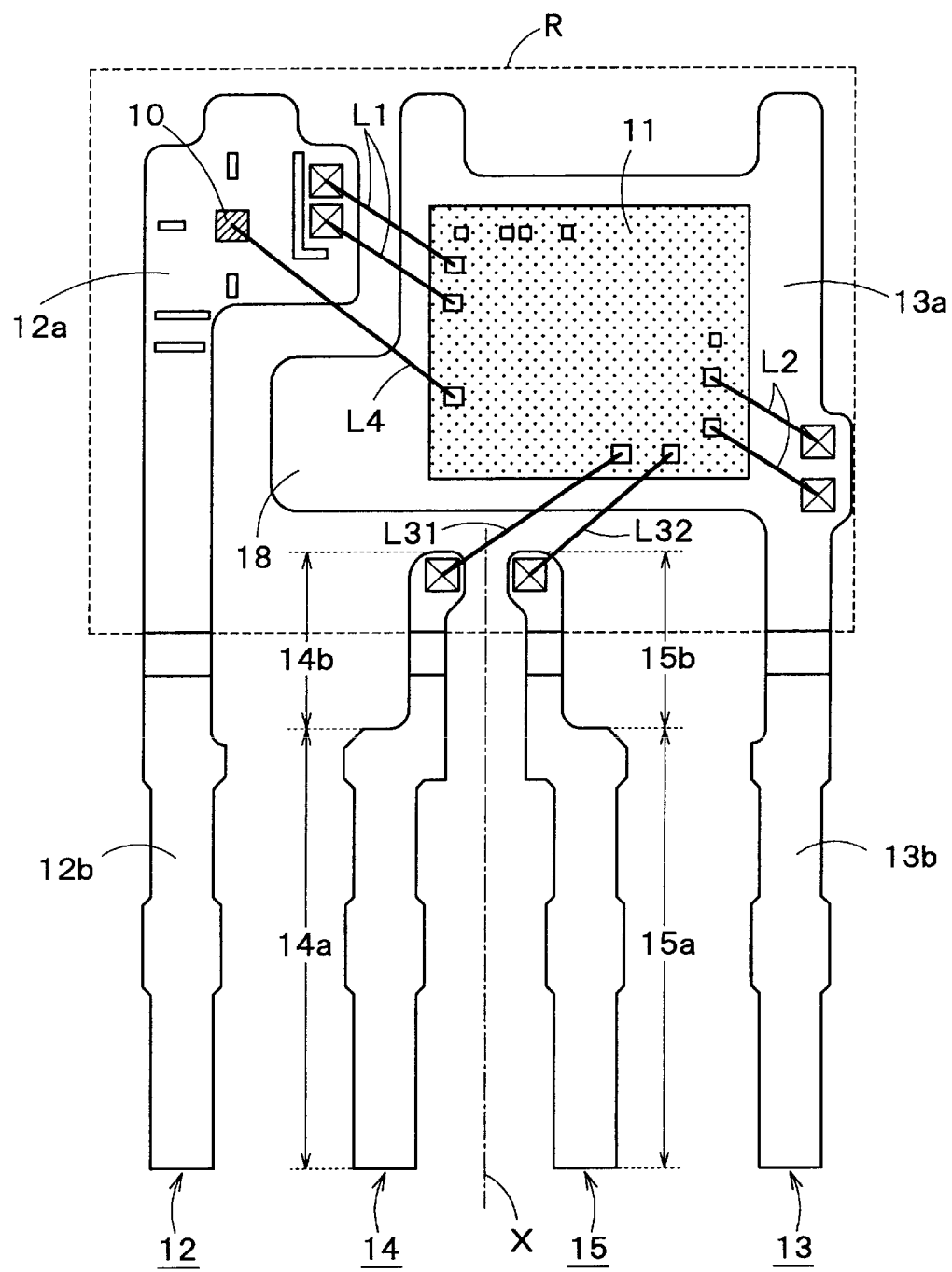
FIG. 10 is a plan view illustrating the frame configuration of a transmitter of an optical coupling device according to a modification (Modification Example 2.2) of the second embodiment.

Modification Example 2.2 of the second embodiment will be described. In this modification example, a shape of the ground frame 13 is different from that in Modification Example 1.2 described above. Hereinafter, a configuration of the ground frame 13 of the optical coupling device according to this modification example will be described with reference to FIG. 10. FIG. 10 is a plan view illustrating a frame configuration of the transmitter of the optical coupling device according to Modification Example 2.2.

As illustrated in FIG. 10, the ground frame 13 according to this modification example includes the third protrusion 18. The third protrusion 18 is configured in a similar manner as in Modification Example 2.1 (illustrated in FIG. 6). That is, the third protrusion 18 protrudes between the first installation portion 12a and the first input signal line portion 14b from the second installation portion 13a.

According to this Modification Example 2.2, the first and the second input signal line portions 14b and 15b are less affected by the electromagnetic waves from the first installation portion 12a due to shielding presence of the third protrusion 18. Accordingly, it is possible to further reduce the electromotive force generated in the first and the second input frames 14 and 15.

In addition, in this modification example, since a planar area of the second installation portion 13a is increased due to the third protrusion 18, the heat dissipation pathway of the transmission IC 11 is increased. Therefore, a temperature change in the transmission IC 11 during operation is reduced, such that it is possible to suppress a change in the offset voltage caused by the temperature change.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupling device, comprising:
    a power frame including a first installation portion and a power line portion connected to the first installation portion, the first installation portion having a light-emitting element disposed thereon;
    a ground frame including a second installation portion and aground line portion connected to the second installation portion, the second installation portion having a drive circuit disposed thereon, the drive circuit configured to drive the light-emitting element;
    a first input frame including a first input terminal portion that is between the power line portion and the ground line portion and a first input signal line portion that is closer to the drive circuit than is the first input terminal portion; and
    a second input frame including a second input terminal portion that is between the first input terminal portion and the ground line portion and a second input signal line portion that is closer to the drive circuit than is the second input terminal portion, wherein
    the first and second input frames are adjacent to each other, and
    a minimum distance from the first input signal line portion to the first installation portion is greater than a minimum distance from the first input signal line portion to the power line portion.

2. The optical coupling device according to claim 1, wherein
    a line width of the first input signal line portion is equal to a line width of the first input terminal portion, and
    a line width of the second input signal line portion is equal to a line width of the second input terminal portion.

3. The optical coupling device according to claim 1, wherein
    a line width of the first input signal line portion is less than a line width of the first input terminal portion, and
    a line width of the second input signal line portion is less than a line width of the second input terminal portion.

4. The optical coupling device according to claim 1, wherein a spacing distance between the first input signal line portion and the second input signal line portion is shortest at end portions of the first and second input signal line portions that are nearest the drive circuit.

5. The optical coupling device according to claim 1, wherein the first input frame and the second input frame are mirror images of each other with respect to a center line extending in a longitudinal direction between the first input frame and the second input frame.

6. The optical coupling device according to claim 1, further comprising:
    a first wire that electrically connects the drive circuit and the first installation portion and extends in a first direction;
    a second wire that extends in the first direction and electrically connects the drive circuit and the light-emitting element;
    a third wire that extends in the first direction and electrically connects the drive circuit and the ground line portion;
    a first signal wire that extends in a second direction intersecting the first direction and electrically connects the drive circuit and the first input signal line portion; and
    a second signal wire that extends in the second direction and electrically connects the drive circuit and the second input signal line portion.

7. The optical coupling device according to claim 6, wherein the ground frame includes:
    a first protrusion that extends from the second installation portion and is between the power line portion and the first input signal line portion, and
    a second protrusion that extends from the second installation portion and is between the ground line portion and the second input signal line portion.

8. The optical coupling device according to claim 7, wherein the ground frame includes a third protrusion which extends from the second installation portion and is between the first installation portion and the first input signal line portion.

9. The optical coupling device according to claim 6, wherein the ground frame includes a third protrusion which extends from the second installation portion and is between the first installation portion and the first input signal line portion.

10. The optical coupling device according to claim 1, wherein the ground frame includes a third protrusion which extends from the second installation portion and is between the first installation portion and the first input signal line portion.

11. The optical coupling device according to claim 1, wherein the ground frame includes:
   a first protrusion that extends from the second installation portion and is between the power line portion and the first input signal line portion, and
   a second protrusion that extends from the second installation portion and is between the ground line portion and the second input signal line portion.

12. An optical coupling device, comprising:
   a first frame including a first installation portion and a first power terminal portion extending from first installation portion along a first direction, the first installation portion having a light-emitting element disposed thereon;
   a second frame including a second installation portion and a second power terminal portion extending from the second installation portion along the first direction, the second installation portion having an integrated circuit disposed thereon, the integrated circuit configured to supply control signals to the light-emitting element;
   a first input frame including a first input terminal portion and a first input signal line portion that is between the second installation portion and the first input terminal portion along a longitudinal direction of the first input frame; and
   a second input frame including a second input terminal portion and a second input signal line portion that is between the second installation portion and the second input terminal portion along a longitudinal direction of the second input frame, wherein
   the first and second input frames are adjacent to each other in a second direction crossing the first direction,
   the first input terminal portion is between the first power terminal portion and the second input terminal in the second direction,
   the second input terminal portion is between the second power terminal and the first input terminal in the second direction, and
   the first input frame and the second input frame are mirror images of each other with respect to a center line extending in a longitudinal direction between the first input frame and the second input frame.

13. The optical coupling device according to claim 12, wherein a minimum distance from the first input signal line portion to the first installation portion is greater than a minimum distance from the first input signal line portion to the first power terminal portion.

14. The optical coupling device according to claim 12, wherein a minimum distance from a first end of the first input frame along the longitudinal direction of the first input frame to the first installation portion is greater than any distance along the second direction from the first input frame to the first frame, the first end of the first input frame being an end of the first input frame nearest the second installation portion along the longitudinal direction of the first input frame.

15. The optical coupling device according to claim 12, wherein
   a line width of the first input signal line portion in the second direction is equal to a line width of the first input terminal portion in the second direction, and
   a line width of the second input signal line portion in the second direction is equal to a line width of the second input terminal portion in the second direction.

16. The optical coupling device according to claim 12, wherein
   a line width of the first input signal line portion in the second direction is less than a line width of the first input terminal portion in the second direction, and
   a line width of the second input signal line portion is less than a line width of the second input terminal portion.

17. The optical coupling device according to claim 12, wherein the second frame includes:
   a first protrusion that extends from the second installation portion and includes a portion that is between the first power terminal portion and the first input signal line portion in the second direction, and
   a second protrusion that extends from the second installation portion and includes a portion that is between the second power terminal portion and the second input signal line portion in the second direction.

18. The optical coupling device according to claim 12, wherein the second frame includes a protrusion that extends from the second installation portion and includes a portion that is between the first installation portion and the first input signal line portion.

19. An optical coupling device, comprising:
   a power lead frame including a first installation portion and a power line portion extending from the first installation portion along a first direction, the first installation portion having a light-emitting element disposed thereon;
   a ground lead frame including a second installation portion and a ground line portion extending from the second installation portion along the first direction, the second installation portion having a drive circuit disposed thereon, the drive circuit configured to drive the light-emitting element;
   a first input lead frame including a first input signal line portion and a first input terminal portion that is between the power line portion and the ground line portion in a second direction crossing the first direction and a spacing along the first direction between the first input signal line portion and the second installation portion is less than a spacing along the first direction from the first input signal line portion to the first installation portion; and
   a second input lead frame including a second input signal line portion and a second input terminal portion that is between the first input terminal portion and the ground line portion in the second direction and a spacing along the first direction from the second input signal line portion and the second installation portion is less than a spacing along the first direction from the second input signal line portion to the first installation portion, wherein
   the first and second input lead frames are adjacent to each other in the second direction, and a minimum distance from the first input signal line portion to the first installation portion is greater than a minimum distance along the second direction from the first input signal line portion to the power line portion.

20. The optical coupling device according to claim 19, wherein the first input frame and the second input frame are mirror images of each other with respect to a center line between the first input frame and the second input frame that extends along the first direction.

* * * * *